United States Patent [19]

Burroughs et al.

[11] Patent Number: 4,840,568
[45] Date of Patent: Jun. 20, 1989

[54] JACK ASSEMBLY

[75] Inventors: Dennis M. Burroughs, Savage; Thomas W. Cruise, Coon Rapids, both of Minn.

[73] Assignee: ADC Telecommunications, Inc., Minneapolis, Minn.

[21] Appl. No.: 243,180

[22] Filed: Sep. 8, 1988

Related U.S. Application Data

[63] Continuation of Ser. No. 32,880, Mar. 31, 1987, abandoned.

[51] Int. Cl.$^4$ .............................................. H05K 7/10
[52] U.S. Cl. .................................. 439/49; 361/415; 439/61; 439/354; 439/668
[58] Field of Search .................. 439/43, 49, 54, 61, 439/62, 64, 668, 669, 354, 709; 361/394, 395, 399, 413, 415; 379/326–329; 200/51.1, 51.07, 51.09

[56] References Cited

U.S. PATENT DOCUMENTS

| | | | |
|---|---|---|---|
| 3,177,404 | 4/1965 | Patmore | 439/61 |
| 3,524,198 | 8/1970 | Malmstadt et al. | 317/101 |
| 3,627,942 | 12/1971 | Bobb | 200/51.07 |
| 3,755,630 | 8/1973 | Boyer . | |
| 3,784,962 | 1/1974 | Byrd | 339/121 |
| 3,852,703 | 12/1974 | Carney et al. | 339/198 H |
| 3,871,728 | 3/1975 | Goodman | 339/14 |
| 3,942,077 | 3/1976 | Powers | 317/118 |
| 4,017,770 | 4/1978 | Valfre . | |
| 4,018,997 | 4/1977 | Hoover et al. | 179/98 |
| 4,073,563 | 2/1978 | Bailey . | |
| 4,087,648 | 5/1978 | Glacoppo | 179/98 |
| 4,146,755 | 4/1979 | Causse | 179/98 |
| 4,154,994 | 5/1979 | Seiden et al. | 200/51.07 |
| 4,160,880 | 7/1979 | Brey | 179/98 |
| 4,165,147 | 8/1979 | Buck | 339/182 R |
| 4,204,095 | 5/1980 | De Luco et al. | 179/98 |
| 4,221,445 | 9/1980 | Fleischhacker | 339/18 |
| 4,235,501 | 11/1980 | Ericsson | 339/191 |
| 4,237,352 | 12/1980 | Seiden | 200/51.03 |
| 4,260,856 | 4/1981 | Saligny | 179/98 |
| 4,269,463 | 5/1981 | Beatenbough | 339/91 |
| 4,401,351 | 9/1983 | Record | 339/17 |

(List continued on next page.)

OTHER PUBLICATIONS

ADC Telecommunications, Inc. Product brochure entitled "DSX Digital Signal Cross-Connect Second Edition" copyright 1987.
Switchcraft, Inc. Bulletin, No. 397, dated 1987.
Advertisements for Augat Telzon regarding Modular DSX Jack.
AT&T Technical Descriptions, Cir. 365-099-025TD, Jan. 1986, Issue 1.
Telect advertisement for a DSX Module.

*Primary Examiner*—Neil Abrams
*Attorney, Agent, or Firm*—Merchant, Gould, Smith, Edell, Welter & Schmidt

[57] ABSTRACT

A jack assembly is disclosed including a mount having a plurality of electrical contact members disposed in a predetermined array and a plurality of jacks. The jacks are releasably attachable to the mount. Each of the jacks includes a jack body formed of dielectric material. The body has an interior with a plurality of bores extending through the body in communication with the interior. The bores are sized to receive tip-and-ring plugs of known dimensions. A plurality of electrically conductive spring contacts are disposed within the chambers with first ends thereof presenting electrical contact points disposed in a predetermined array. A circuit board is attached to the body and has circuitry which includes a first and second plurality of circuit contact points. The first plurality of circuit contact points is disposed on the circuit board to make electrical contact with the electrical contact points of the spring contacts when the circuit board is connected to the body. The second plurality of circuit contact points are disposed to make electrical contact with the plurality of exposed electrical contact members of the mount when the jack is attached to the mount. A plurality of wire termination membes are secured to the body and present wire termination ends facing an operator. The circuit board engages contacts of the wire termination members in electrical contact to connect the members to circuitry of the jack.

14 Claims, 12 Drawing Sheets

U.S. PATENT DOCUMENTS

| | | | |
|---|---|---|---|
| 4,423,466 | 12/1983 | Beun | 439/668 |
| 4,425,018 | 1/1984 | Stenz | 339/198 |
| 4,439,809 | 3/1984 | Weight et al. | 361/220 |
| 4,470,100 | 9/1984 | Rebaudo et al. | 361/413 |
| 4,510,552 | 4/1985 | Kanno et al. | 361/413 |
| 4,521,063 | 6/1985 | Mile | 361/17 |
| 4,536,052 | 8/1985 | Baker et al. | 339/126 |
| 4,548,447 | 10/1985 | Dinsmore | 339/14 |
| 4,581,489 | 4/1986 | Nozick | 179/98 |
| 4,588,251 | 5/1986 | Newton | 339/182 |
| 4,596,436 | 6/1986 | Kraemer et al. | 339/206 |
| 4,605,275 | 8/1986 | Pavel | 339/119 |
| 4,618,194 | 10/1986 | Kwilos | 339/14 |
| 4,655,535 | 4/1987 | Kysiak | 339/182 |
| 4,695,117 | 9/1987 | Kysiak | 439/668 |
| 4,695,920 | 9/1987 | Klebba et al. | 361/415 |
| 4,737,113 | 4/1988 | Hopper | 439/78 |
| 4,768,961 | 9/1988 | Lau | 439/61 |
| 4,770,639 | 9/1988 | Lau | 439/61 |
| 4,797,114 | 1/1988 | Lau | 439/79 |

JACK ASSEMBLY

This is a continuation of application Ser. No. 032,880 filed Mar. 31, 1987 and now abandoned.

BACKGROUND OF THE INVENTION

I. Field of the Invention

This invention relates to cross-connect assemblies and, in particular, to a jack assembly for a digital cross-connect system.

II. Background of the Prior Art

A digital cross-connect system (DSX) provides a location for interconnecting two digital transmission paths. The apparatus for a DSX is located in one or more frames, or bays, usually in a telephone central office. The DSX apparatus also provides jack access to the transmission paths.

DSX jacks are well-known and include a plurality of spring contacts for receiving tip-and-ring plugs. The jacks are commonly ganged in a common housing which is mounted on a frame. The jacks are typically hard wired to wire termination pins which were mounted on a side of the housing opposite plug access openings.

Prior art DSX apparatus typically required substantial space to permit an operator to have access to the rear of the housing in order to perform desired cross-connect wiring. The apparatus was also inflexible in its design and did not provide for any significant electronics, such as signal enhancement circuitry, between the springs and the termination pins.

SUMMARY OF THE INVENTION

We have determined that current electronic component surface mount technology can be incorporated into the jack design to enhance the electronic and circuitry mined that the jack design can include means for permitting an operator to perform desired cross-connect wiring without need for access to a rear portion of the assembly. Finally, we have conceived a design permitting greater user flexibility.

According to a preferred embodiment of the present invention, a jack assembly is disclosed. The assembly includes a mount having a plurality of exposed electrical contact members and a plurality of jacks with means for releasably attaching each of the jacks to the mount. Each of the jacks include a jack body of dielectric material. The body has an interior chamber with a plurality of bores extending through a front wall of the body in communication with the chamber. The bores are sized to receive a tip-and-ring plug of predetermined dimensions. A plurality of conductive spring contacts are disposed within the chamber with first ends of the spring contacts secured to the body. A circuit board is provided with means for connecting the circuit board to the body. The circuit board includes circuitry having a first plurality of circuit contact points which are disposed to make electrical contact with the spring contacts when the circuit board is attached to the dielectric body. The circuit board also includes a second plurality of circuit contact points which are disposed to make electrical contact with the exposed electrical contact members of the mount when the jack is attached to the mount.

DESCRIPTION OF THE PREFERRED EMBODIMENT

I. General Description

Figure 1:
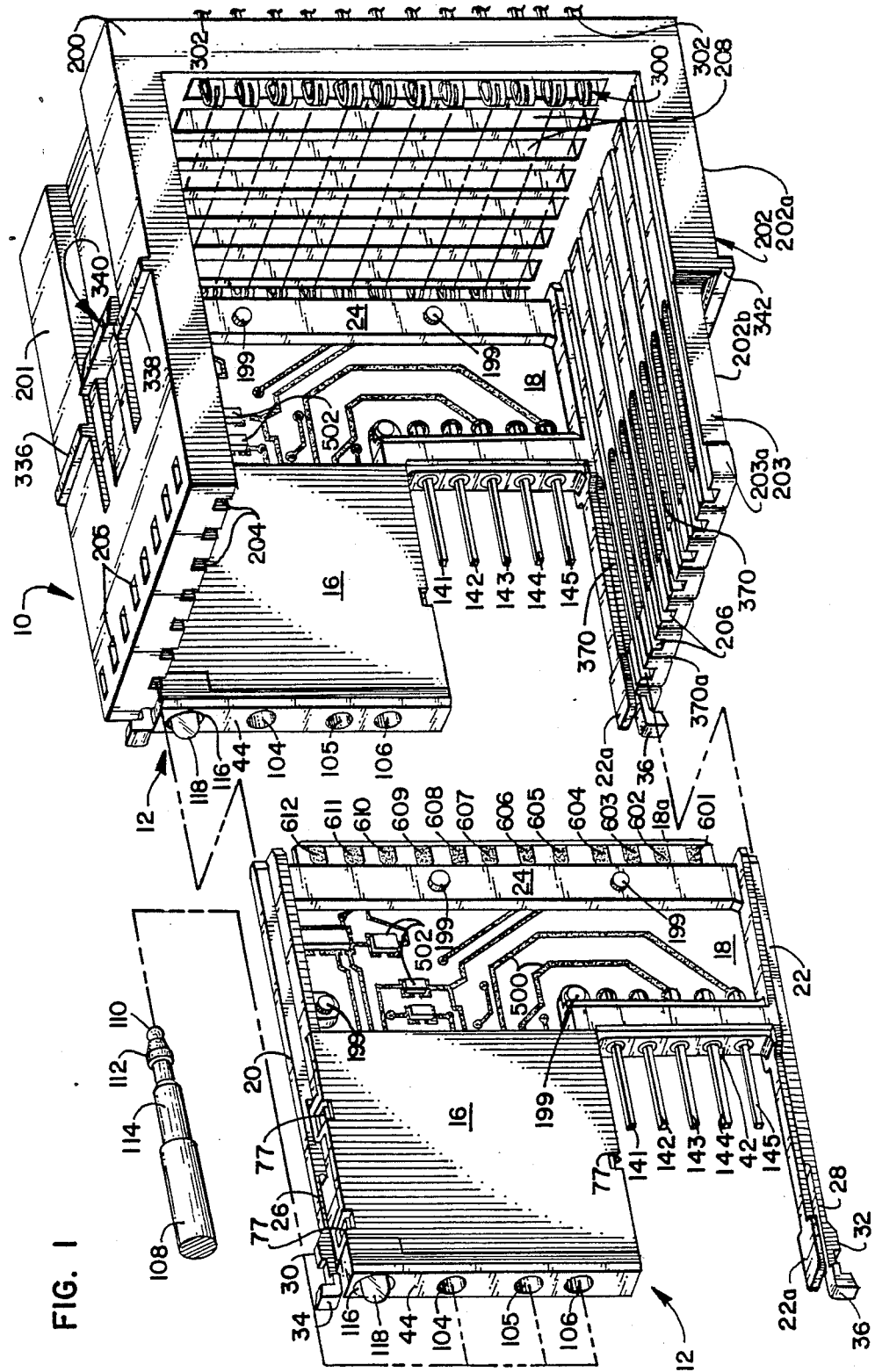
FIG. 1 is an exploded perspective view of a jack assembly according to the present invention.

Referring now to the several figures in which identical parts are numbered identically throughout, the jack assembly of the present invention will be described with reference to a preferred embodiment. Referring to FIG. 1, the jack assembly includes a housing or jack mount 10 and a plurality of jacks 12. In the preferred embodiment eight jacks 12 will be associated with each jack mount 10. Since each jack 12 is identical, a description of one will suffice as a description of all jacks. In FIG. 1, only two jacks 12 are shown in order to provide ease of description of the jack 12 and jack mount 10.

II. Jack Description A. Jack Body and Cover

Jack 12 includes a jack body 14, a body cover 16, a circuit board 18, and a plurality of wire wrap termination pins and spring contacts as will be described. Shown best with reference to FIGS. 2, 4 and 9, the jack body 14 is formed of plastic or any suitable dielectric material. Preferably, body 14 and its elements are integrally formed by injection molding.

Jack body 14 includes parallel upper and lower rails 20,22 respectively. Rear ends of rails 20,22 are joined by a vertical post 24. The forward ends of rails 20,22 are provided with resilient cantilevered portions 26,28 which include upper and lower snap lock members 30,32. Portions 26,28 terminate at operator engageable tabs 34,36 which are provided with roughened surfaces which may be gripped by the opposing fingers of an operator to urge tabs 34,36 toward one another. In the Figures, the tabs 34,36 are shown in their rest or untensioned positions. Lower rail 22 has an enlarged portion 22a at its forward end.

Connected to upper rail 20 at its forward end is a spring housing portion 38 of body 14. Housing 38 includes a forward wall 44 which extends from a forward end of rail 20 toward rail 22. Intermediate forward wall 44 and vertical post 24, housing 38 includes a rear wall 62 which also extends partly the distance from rail 20 toward rail 22. Forward wall 44 and rear wall 62 are joined by top wall 64 and bottom wall 66. At the point of intersection of rear wall 62 and bottom wall 66, housing portion 38 is connected to lower rail 22 by means of intermediate vertical post 42. Rear wall 62, vertical post 24, intermediate post 42 and rails 20,22 all cooperate to define an enlarged open area 43.

Figure 2:
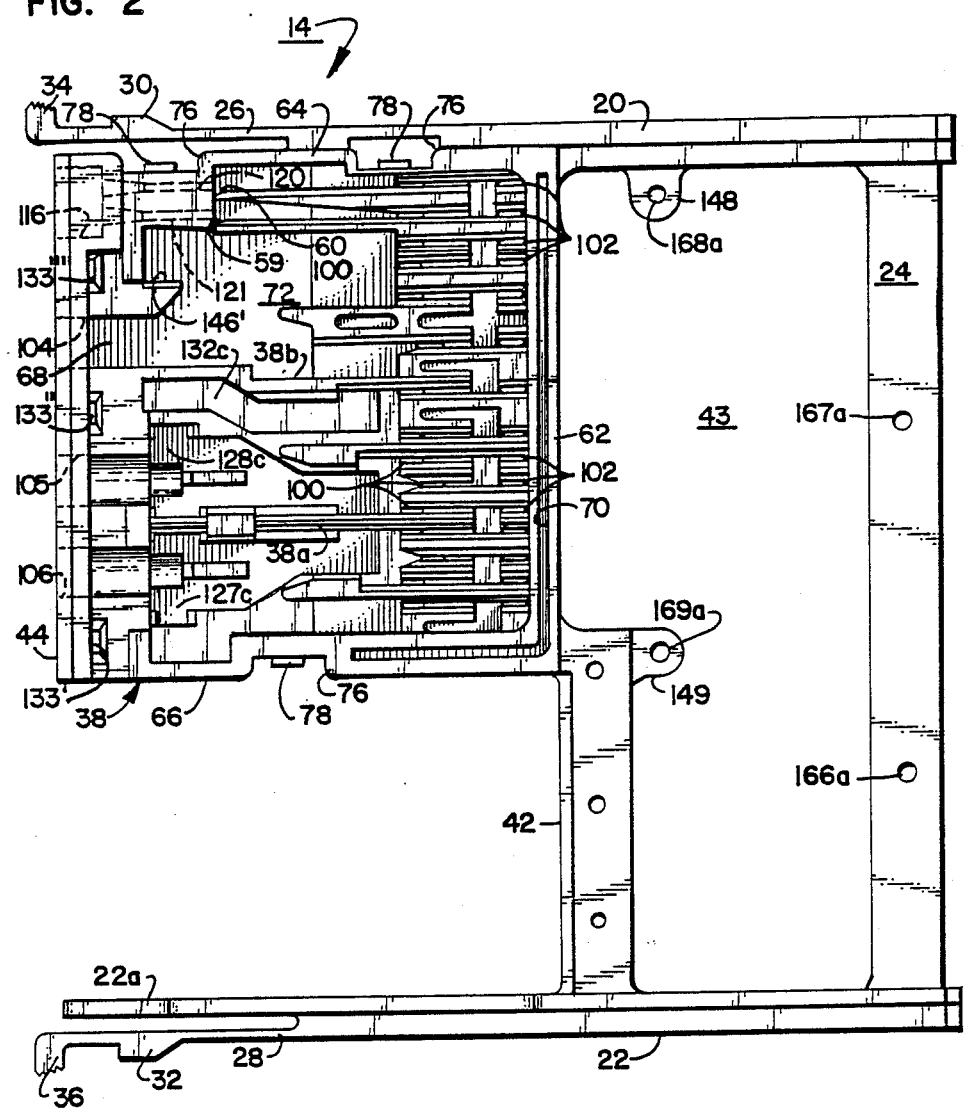
FIG. 2 is a right side view, taken in elevation, of a jack body of the present invention.
Figure 3:
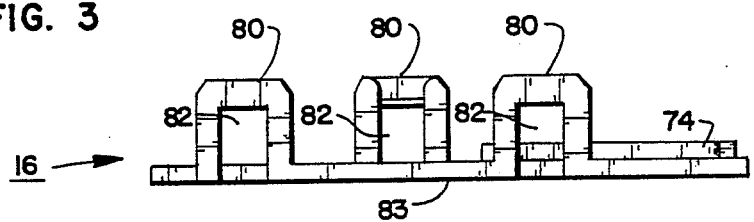
FIG. 3 is a side view of a jack body cover according to the present invention.
Figure 4:
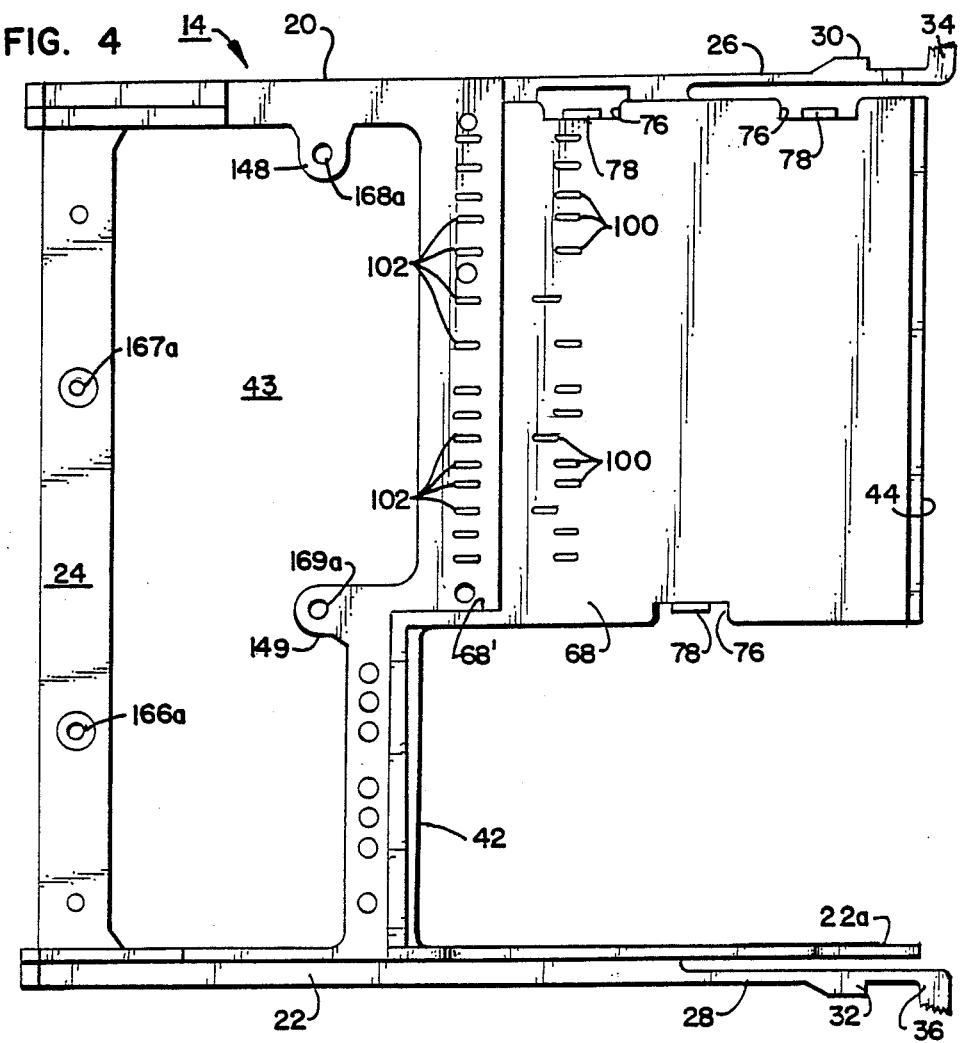
FIG. 4 is a left side view, taken in elevation, of the jack body of FIG. 2.

For ease of description, the view of FIG. 2 will be referred to as the right side of the body portion 14 and the view of FIG. 4 will be referred to as the left side. As shown in FIG. 4, the left side of the housing portion 38 is generally flat. By contrast, the right side of the housing portion 38 is recessed to define a chamber 72. Within the chamber 72, a plurality of raised platforms 46-61 are provided. The platforms 46-61 are disposed along the rear wall 62 of housing portion 38.

On the left side of housing 38 (as shown in FIG. 4), the chamber 72 is closed by an integrally formed left side wall 68. The chamber of the housing portion 38 is closed by means of body cover 16.

Cover 16 includes a cover plate 83 sized to completely cover the chamber 72. As shown best in FIG. 9, rear wall 62 and bottom wall 66 have formed therein an L-shaped slot 70. Body cover 16 is provided with an L-shaped rib 74 which is sized to be snugly received within L-shaped slot 70 when cover 16 is placed on housing portion 38 in proper alignment.

Cover 16 is secured to housing portion 38 by means of three snap locks 77. Each of the snap locks 77 is identical and, accordingly, each is identically numbered.

Snap locks 77 consist of slots 76, locking blocks 78 and locking tabs 80. Two slots 76 are formed in top wall 64 and one such slot 76 is formed in bottom wall 66. Placed within each of slots 76 is a centrally positioned locking block 78. Cover 16 is provided with three locking tabs 80. Each of the tabs 80 are provided with centrally located openings 82 which are sized to receive locking blocks 78.

Cover 16 is installed by aligning cover plate 83 with L-shaped rib 74 aligned with L-shaped slot 70. Cover 16 is urged toward housing 38. When so urged, tabs 80 flex over blocks 78. When the cover is completely installed, the blocks 70 are received within openings 82 and thereby lock the cover 16 to housing portion 38.

As mentioned, disposed within chamber 72 are a plurality of raised platforms 46-61. In a preferred embodiment there are 16 such platforms and opposing surfaces of contiguous platforms define a plurality of parallel aligned spaced apart spring receiving slots 84-98 The slots 84-98 are parallel to the top and bottom walls 64,66. Shown most clearly in FIG. 9, the raised platforms extend from left side wall 68 and terminate at beveled ends facing cover 16. Opposing beveled ends define enlarged slots which act to guide insertion of spring contacts into slots 84-98 as will be described.

Left side wall 68 is provided with a plurality of openings 100 and 102 therethrough. Openings 100,102 are in communication with spring receiving slots 84-98. Each of the spring receiving slots 84-8 is in communication with one of the plurality of openings 100 and one of the plurality of openings 102.

The front wall 44 of housing portion 38 is provided with three bores 104,105,106 therethrough in communication with chamber 72. For convenience, bore 104 will be referred to as a monitor bore 104 (or simply MON bore), bore 106 will be referred to as IN bore 106 and bore 105 will be referred to as OUT bore 105. Each of the bores is sized to receive a standard tip-and-ring plug 108 of known dimensions. Plug 108 includes a tip contact 110, a ring contact 112 and a cylindrical sleeve 114. The thin design of each of the modular jacks 12 are preferably controlled such that the spacing between the IN bores and OUT bores of adjacent jacks is identical to the spacing between the IN and OUT bores on the same jack.

Forward wall 44 includes a fourth bore 116 sized to receive a light emitting diode (LED) 118. Shown best in FIG. 8, bore 116 is partially recessed into forward wall 44. From bore 116, two holes 120 and 121 extend from bore 116 into chamber 72. The holes 120,121 are sized to receive electrical leads 122,123 extending from an LED 118 inserted into bore 116.

B. Spring Contacts
1. Spring Contacts Generally

A plurality of spring contacts 124-138 are provided disposed within chamber 72. First ends of the spring contacts 124-138 are separately received in spring receiving slots 84-98.

Figure 5:
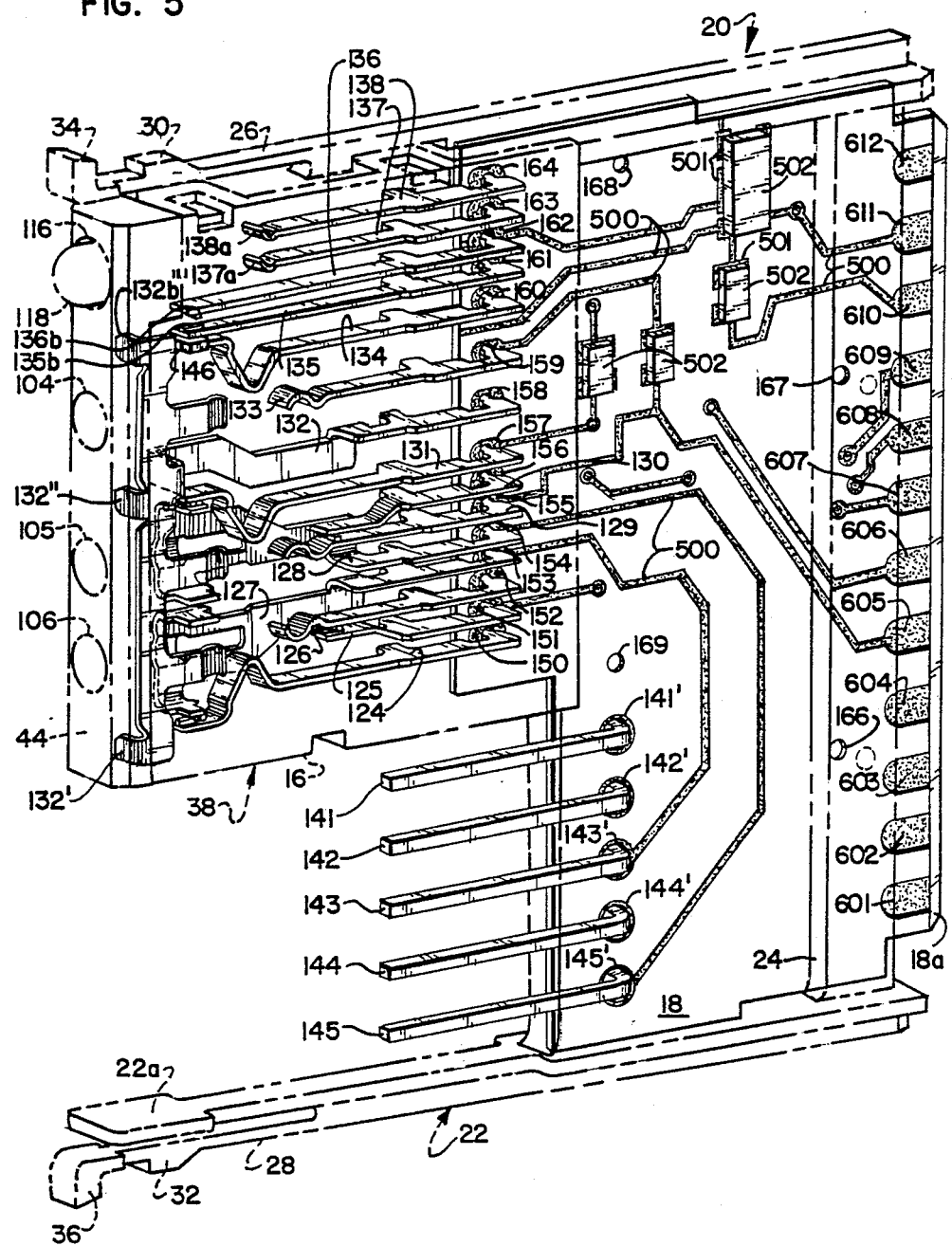
FIG. 5 is a perspective view of the jack assembly of the present invention shown partly in phantom and showing arrangement of the spring contacts of the present invention.

The arrangement of spring contacts 124-138 is most clearly shown in FIG. 5. In FIG. 5, the spring contacts 124-138, circuit board 18 and cross-connect wire termination pins 141-145 are shown. In FIG. 5, jack body 14 is shown in phantom lines to indicate the relative positioning of parts in a manner which is believed to illustrate the spring contacts 124-138 most clearly.

2. Ring and Tip Contacts

Figure 8:
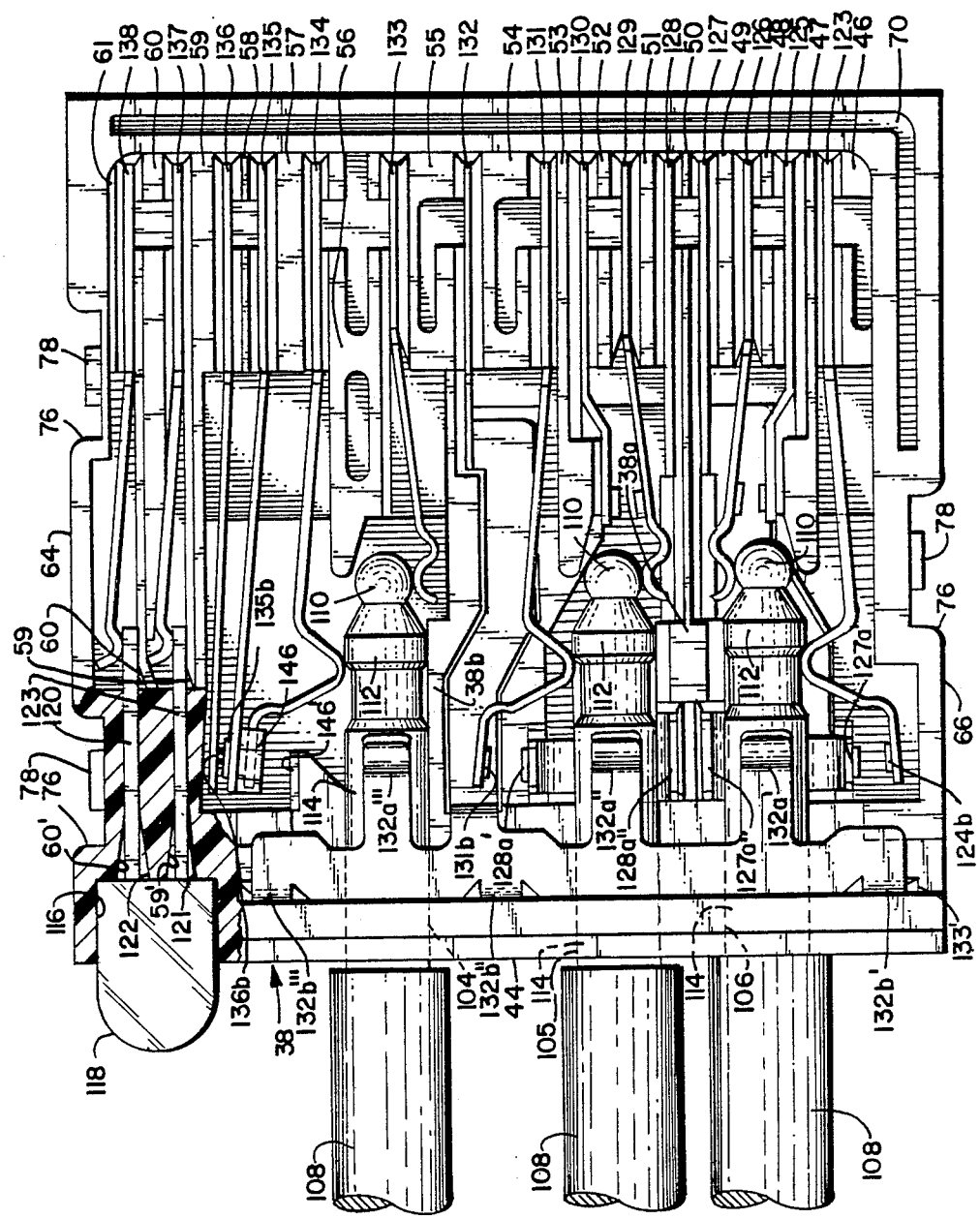
FIG. 8 is a side plan view of a portion of the jack of the present invention.
Figure 9:
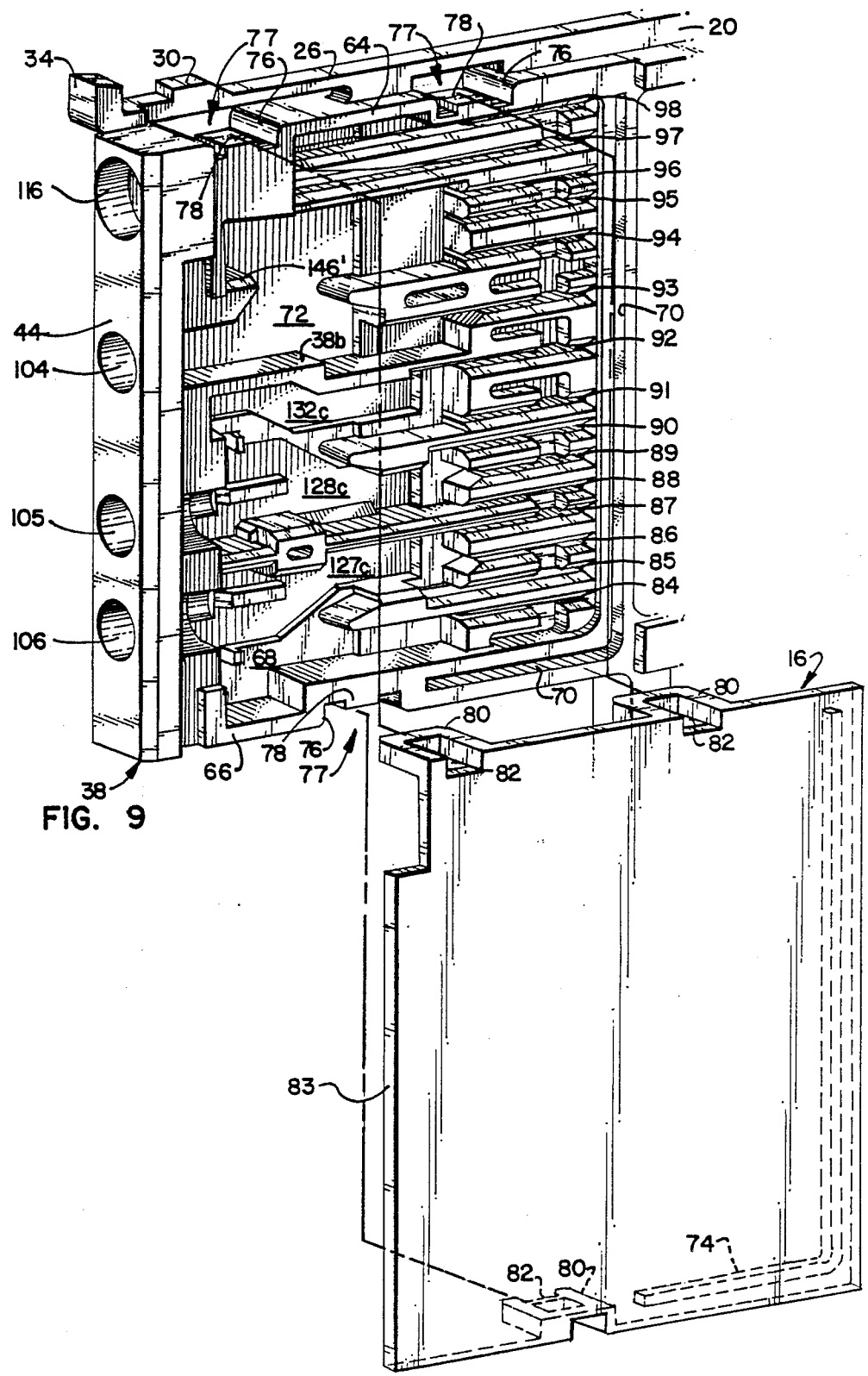
FIG. 9 is an exploded view taken in perspective showing a portion of the jack body and the jack body cover.

The plurality of spring contacts 124-138 include ring spring contacts 124,131,134 which are disposed within slots 84,91,94. (for clarity, slot identification numbering is shown in FIG. 9). Ring spring contacts 124,131,134 are disposed to make electrical connection with the ring contacts 112 of tip-and-ring plugs 108 inserted within bores 106,105,104, respectively (as shown in FIG. 8). Similarly, the plurality of spring contacts include tip contacts 126,129,133 which are disposed within their respective slots to make electrical contact with the tip contacts 110 of plugs 108 disposed within bores 106,105,104, respectively. In housing 38, walls 38a38b separate chamber 72 into separate chambers for spring contacts associated with the IN bore 106, OUT bore 105 and monitor bore 104.

3. Tip Normal Contacts

The plurality of spring contacts including tip normal spring contacts 125,130 which are disposed within chamber 72 for tip normal contact 125 to be in electrical contact with tip contact 126 when no plug 108 is inserted within IN bore 106 (as shown in FIG. 5). Similarly, tip normal contact 130 is disposed within chamber 72 to make electrical contact with tip ring contact 129 when no plug is received within OUT bore 105.

4. Ring Normal Contacts

Figure 7:
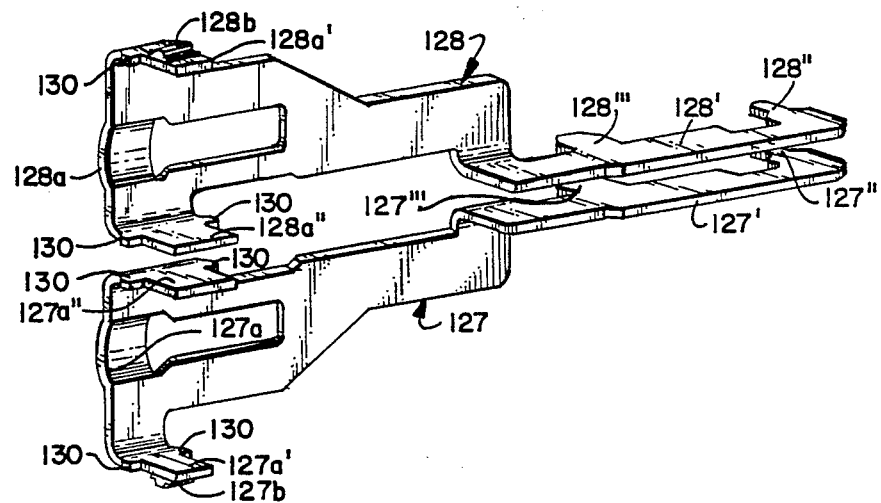
FIG. 7 shows perspective views of two spring contacts for use in the present invention.

The plurality of spring contacts further includes ring normal contacts 127 and 128. Ring normal contacts 127,128 are separately shown in FIG. 7. Each of ring normal contacts 127,128 have flat first ends 127', 128'. Flat first end 127' is received within slot 87. Similarly, first end 128' is received within slot 88. The first ends 127', 128' are both provided with protruding tabs 128", 128''', 127", and 127'''. The tabs lie in the same plane as the flat first ends.

Contacts 127,128 have second ends 127a, 128a which are generally U-shaped and present upwardly projecting tabs 128a", 128a', 127a' and 127a". Tabs 127'and 128a' are provided with contact elements 127b and 128b. All of the tabs are provided with barbs 130.

Contacts 127 and 128 are inserted into the chamber with an operator forcing flat portions 127' and 128' into their receiving slots. Simultaneously, tabs 128a', 128a', 127a', 127a" are forced into the chamber 72 with barbs 130 being forced into surrounding plastic material of the housing portion 38 in order to securely lock the spring contacts 127,128 into the housing portion 38.

Shown best in FIG. 9 left wall 68 is provided with recesses 127c, 128c in communication with chamber 72. Recesses 127c, 128c, are shaped to receive spring contacts 127,128 respectively, when the ends 127', 128' contacts are inserted into chamber 72.

Ring normal contacts 127,128 are configured for contact elements 127b, 128b to be in electrical contact with contact elements 124b, 131b of ring contacts 124,131 when no plugs are inserted within bores 106,105.

5. Grounding Spring Contacts

Figure 6:
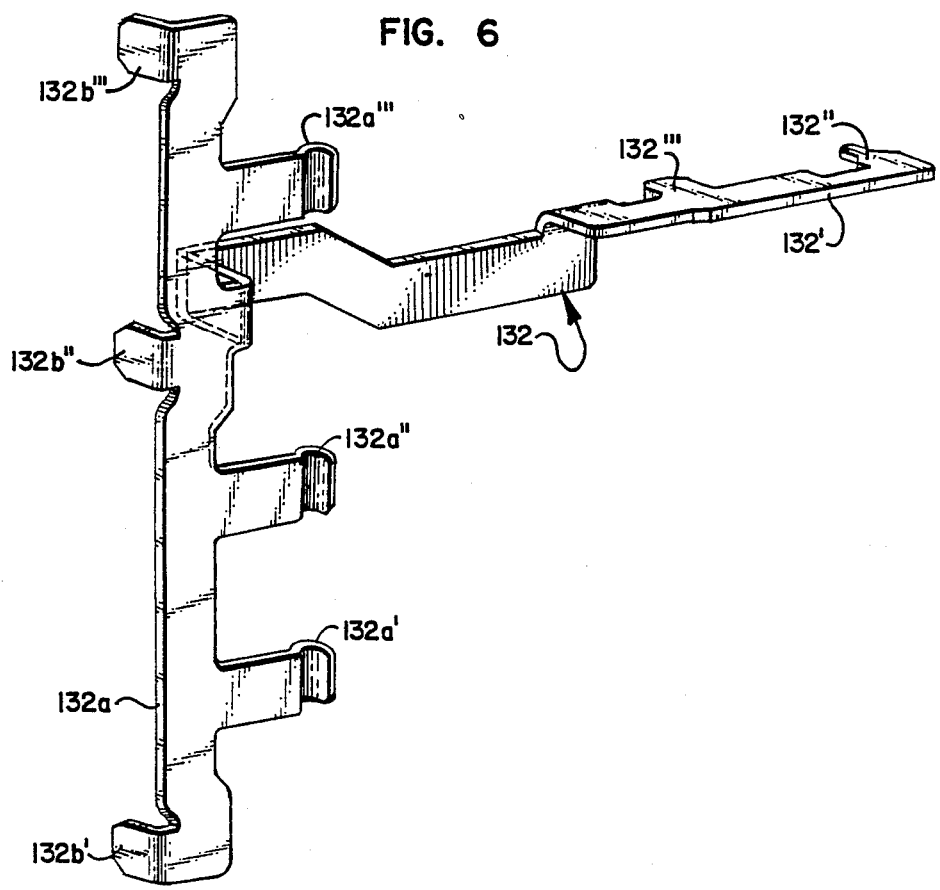
FIG. 6 is a perspective view of a grounding spring contact.

The plurality of spring contacts includes contact 132 which is a grounding contact (shown separately in FIG. 6). Like all other spring contacts, contact 132 has a flat first portion 132' which is received within its intended slot 92. Flat portion 132'. has protruding tabs 132" and 132'''. Contact 132 has a second end 132a with a plurality of spring clips 132a', 132a" and 132a'''.

Second end 132a also includes a plurality of tabs 132b', 132b" and 132b'''. Upon insertion of clip 132b', 132b''' are urged 132 into chamber 72, tabs 132b within receiving slots 133', 133", 133'''' (shown in FIG. 2) formed within housing portion 38 to tightly secure clip 132 within chamber 72. As shown in FIG. 9, left wall 68 is provided with a recess 132c shaped to receive grounding contact 132 when contact 132 is inserted into chamber 72.

Spring contact 132 is configured for clips 132a', 132a", 132a''' to engage the sleeve 114 of plugs 108 received within bores 106,105,104, respectively.

6. LED Circuit Actuating Spring Contacts

The plurality of spring contacts includes LED circuit actuating contacts 135,136 which are disposed in parallel relation. Clips 135,136 are provided with opposing contact elements 135b and 136b which are disposed in normal spaced apart relation (shown in FIG. 5).

A free end of ring contact 134 is provided with a sleeve 146 of dielectric material. Sleeve 146 abuts an opposing surface of clip 135. Upon insertion of a plug 108 within bore 104, ring contact 134 is displaced (as shown in FIG. 8) and sleeve 146 urges contact 135 against spring contact 136 with contact elements 135b, 136b l being urged into electrical contact.

The housing portion 38 includes a stop wall 146' within chamber 72. Wall 146' is disposed for sleeve 146 to abut wall 146' when no plug is inserted into bore 104.

7. LED Contacts

The plurality of spring contacts further include LED contacts 137,138. The LED contacts 137,138 are disposed with free ends 137a, 138a positioned to contact the electrical leads 122,123 of an LED 118 inserted within bore 116.

Shown best in FIGS. 2 and 8, platforms 59 and 60 have slanted forward surfaces 59', 60', respectively. Surfaces 59', 60' are disposed to guide LED leads 122,123 from bores 120,121 to contacts 137,138.

8. Spring Contact Tabs

The first ends 127', 128', 132' of spring contacts 127,128,132 have been described in detail. As shown in FIG. 5, all of the spring contacts 124-138 are similar in that each have flat first ends which are received within their respective slots and each have protruding tabs such as tabs 132''' and 132". These plurality of tabs will be conveniently referred to as forward tabs (such as tabs 132''',128''', 127''') and rear tabs (such as tabs 132", 128", 127"). The forward tabs of each of the spring contacts 124-138 are sized to be received within holes 100 (as shown in FIG. 4). Similarly, rear tabs are sized to be received within and project through holes 102.

When the rear tabs (such as tabs 132",128", 127") project through holes 102 they are aligned in a vertical array. While the holes 102 are shown aligned in a vertical array, they could be aligned in any other manner. For example, adjacent holes 102 could be offset from one another. However, the alignment should be predetermined and, for reasons that will become apparent, the tips of the rear tabs should be generally coplanar when the spring contacts are inserted into chamber 72.

C. Circuit Board

Figure 10:
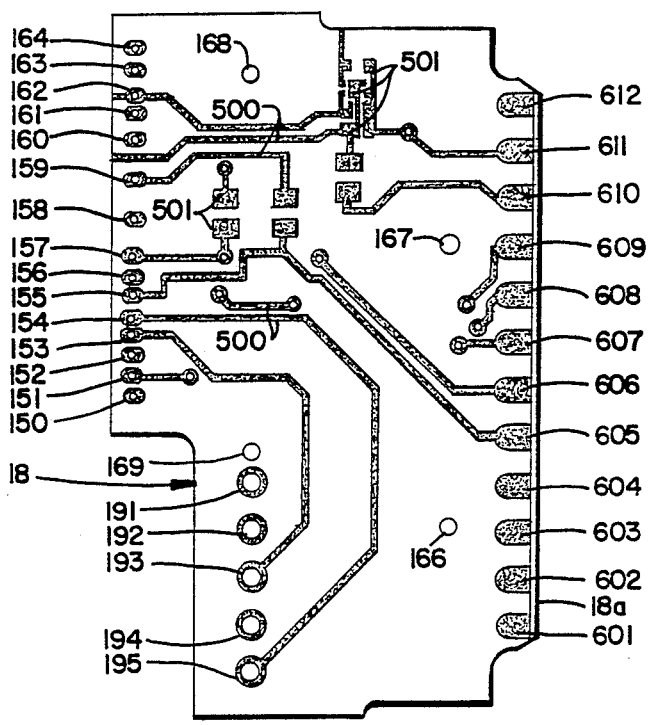
FIG. 10 is a side view of a circuit board for use in the present, invention.

Circuit board 18 is shown separately in Fig. 10. The board 18 is sized to cover the area 43 bounded by top rail 20, bottom rail 22, vertical post 24, intermediate post 42 and rear wall 62. As shown in FIG. 4, body 14 has a recessed area 68' on wall 68. The wall 68 is recessed for board 18 to be flush with or slightly recessed in from wall 68 when board 18 is attached to body 14.

Circuit board 18 is of standard construction and includes circuitry having a first plurality of circuit contact points 150-164 and a second plurality of circuit contact points 601-612. Circuitry of board 18 also includes a third plurality of electrical contact points 191-195.

The circuitry includes a plurality of circuit paths 500 and further includes a plurality of surface mount locations 501 for mounting desired surface mount components 502 (shown in FIGS. 1 and 5). The circuitry will be described later with reference to the circuit schematic shown in FIG. 13. However, it is desirable to here note that the mount locations 501 are disposed for components 502 to be disposed within area 43 when board 18 is attached to body 14 and without components 502 extending beyond either side of jack body 14.

As shown, board 18 includes a plurality of holes 166-169 therethrough which do not form a part of the circuitry. Holes 166,167 are disposed to align with holes 166a and 167a formed in vertical post 24 when board 18 is mounted on jack body 14 in predetermined alignment. Top rail 20 is provided with a protruding member 148 having a hole 168a disposed to align with hole 168. Similarly, intermediate post 42 is provided with a protruding member 149 having a hole 169a disposed to align with hole 169. With the circuit board 18 is properly aligned with body 14 and with holes 166-169 aligned with holes 166a-169a, rivets 199 (shown in FIG. 1) may be passed through the aligned holes to rigidly secure the board 18 to body 14.

The first plurality of circuit board contacts 150-164 are aligned in an array for each of the contacts 150-164 to receive a rear tab of the spring contacts 124-138 extending through holes 102 (as shown in FIG. 5). Solder is applied to each of the contacts 150-164 to insure sound electrical connection between each of the contact points 150-164 and its aligned rear tab protruding through holes 102.

With circuit board 18 attached to body 14, a protruding rear edge 18a of circuit board 18 extends projecting away from vertical post 24 as best shown in FIG. 1. The second plurality of electrical contacts 601-612 are exposed on the protruding edge 18a and aligned in a vertical array.

D. Wire Wrap Termination Pins

As shown in FIG. 1, five wire wrap termination pins 141-145 project extending through the forward wall of intermediate post 42 and are aligned in a plane generally parallel to and in planar alignment with the spring contacts 124-138. The wire wrap termination pins 141-145 have 90° bends terminating at first ends 141'-145' opposing circuit board 18.

The third plurality of circuit board contact points 191-195 are aligned for the contact points 191-195 to receive the first ends 141'-145' of the wire wrap termination pins 141-145. The first ends 141'-145' are soldered to contact points 191-195. Since board 18 is flat and circuit contacts 150-164 are generally coplanar with contacts 191-195, first ends 141'-145' of pins 141-145 are generally coplanar with the exposed tips of the rear tabs of spring contacts 124-138.

E. Circuitry

The circuitry of board 18 includes a plurality of circuit paths 500 connecting various combinations of contact points 150-164, 601-612 and 191-195. The circuitry includes resistors and other circuit elements 502 to provide well-known DSX jack functions.

Figure 13:
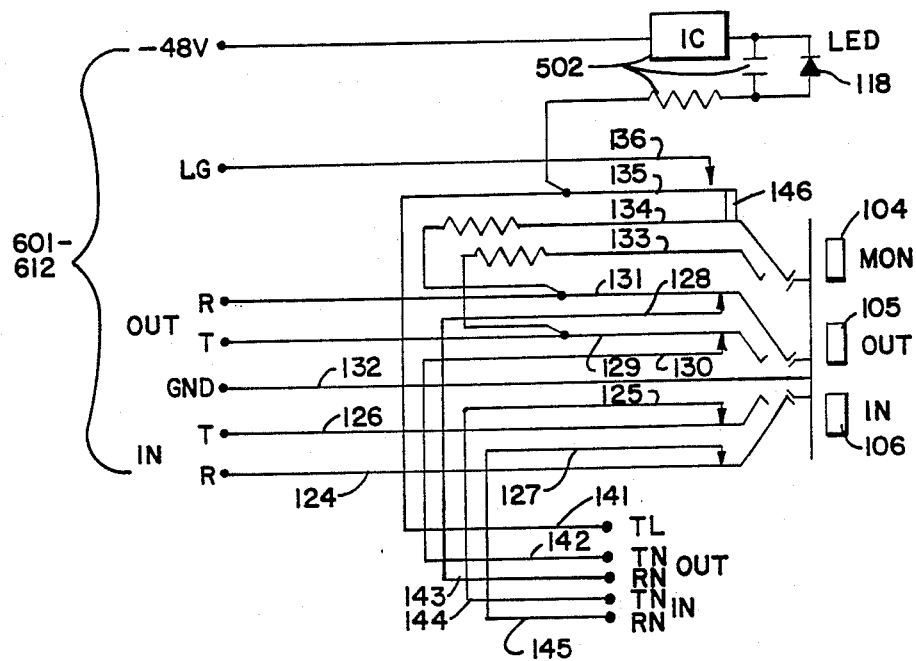
FIG. 13 is a schematic representation of the circuitry of the jack of the present invention.

The schematic of the circuitry of board 18 is shown in FIG. 13. As shown in FIG. 13, the circuitry is designed to accept an OUT signal having a tip line and a ring line each connected to one of points 601 through 612. With no plugs inserted within the jack, this signal is sent to wire termination pins 142,143 and may be cross-connected to another jack as will be described.

As shown in the schematic of FIG. 13, only seven of contact points 601-612 are necessary for conventional DSX jack operation. Which seven may be selected is a matter of choice as long as the particular seven are known and used consistently throughout. The remaining of contact points 601-612 are available for signal enhancement functions as will be described. The seven DSX contact points are an OUT signal tip and ring contact (OUT T and R), an IN signal tip and ring contact (IN T and R), a sleeve ground contact point (GND), a LED ground contact point (LG) and an energized contact point (−48 V) for illuminating LED 118.

Cross connection of a signal from another jack arrives as an IN signal from cross-connect wire termination pins 144 and 145. With no plugs inserted within the jack, the signal is output at IN T and IN R. In FIG. 13, the letters "R" and "t" stand for "ring" and "tip", "GND" stands for "ground", "TN" stands for "tip normal", "RN" stands for "ring normal" and "TL" stands for "tracer lamp".

By inserting a plug within IN bore 106, the IN signal from a cross connected jack can be interrupted and a signal from the inserted plug can be outputted at points IN T and IN R. Similarly, by inserting a plug within the OUT bore 105, the signal from points OUT T and OUT R is interrupted and a may be outputted to the tip and ring contacts 110,112 of the plug.

Frequently, it is desired to be able to monitor signals on the OUT line without interrupting the OUT line signal. To accomplish this, a plug is simply inserted into the monitor bore 104. On this occurrence, ring contact 134 is displaced as shown in FIG. 8. When ring contact 134 is displaced, sleeve 146 acts against spring contact 135 urging its contact point 135b into electrical connection with the contact point 136b of spring contact 136. As is clear from FIG. 13, electrical connection of spring contacts 135,136 connects the LED circuit to ground thereby illuminating the LED. Circuit components 502 (including integrated circuit IC) control flashing of the LED. An example of LED flashing control circuitry may be found in U.S. Pat. No. 4,618,194.

In addition to activating the LED, insertion of a plug into the monitor bore 104 also grounds the tracer lamp line (TL) at wire termination member 141. This causes illumination of an LED on a jack to which the present jack is cross connected. It will be appreciated that the foregoing description of a DSX jack circuitry and its electronic operation is old in the art and forms no part of this invention per se. The foregoing description is illustrative only to aid in a better understanding of the present invention.

III. MOUNT DESCRIPTION

Figure 11:
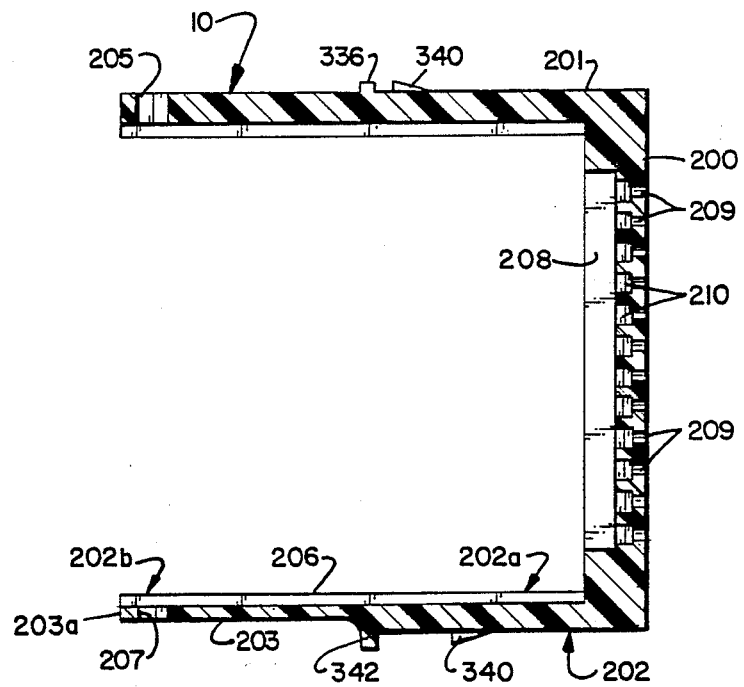
FIG. 11 is a cross-sectional side view of a mount of the present invention.
Figure 17:
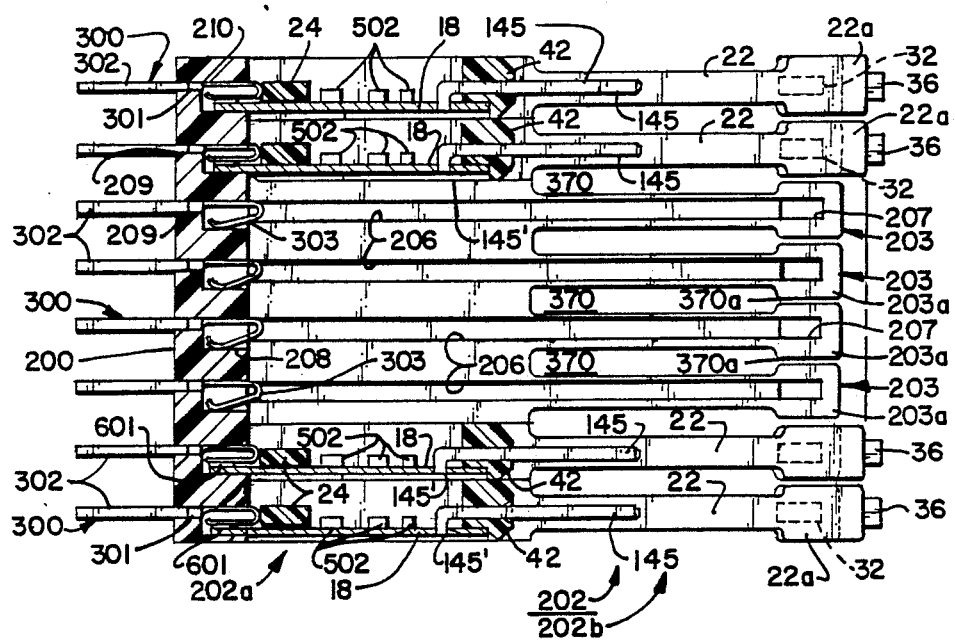
FIG. 17 is a view showing an inner surface of a mount bottom wall.

Referring now to FIGS. 1, 11 and 17, the mount 10 is shown as comprising a back wall 200, a top wall 201 and a bottom wall 202. Top wall 201 extends perpendicular from back wall 200 as does bottom wall 202 to present a generally U-shaped configuration having an open front.

Top wall 201 is provided with a plurality of elongated slots 204 which extend the length of top wall 201 on an interior surface thereof. Similarly, bottom wall 202 includes a plurality of elongated slots 206 which extend the length of bottom wall 202 and are parallel aligned and opposing slots 204. Slots 204 are sized to slidably receive rail 20 therein. Similarly, slots 206 are sized to slidably receive rail 22 therein.

Top wall 201 is also provided with a plurality of openings 205 at a forward end of the wall 201. Openings 205 extend completely through wall 201 and are in communication with each of slots 204. Similarly, the bottom wall 206 is provided with a plurality of openings 207 therethrough and each in communication with slots 206. Openings 205 are sized to receive locking tabs 30 and openings 207 are sized to receive locking tabs 32. Openings 205 and 206 are positioned to receive tabs 30 and 32 when a jack 12 is inserted within mount 10 to a predetermined position (such as that assumed by the jack disposed within the mount in FIG. 1).

The back wall 200 is provided with a plurality of slots 208 arranged in columnar format and aligned in generally the same planes as slots 204 and 206. Back wall 200 also includes a plurality of bores 209 which extend completely through the back wall 200 and in communication with slots 208. Bores 209 include enlarged portions 210 which are in direct communication with slots 208. The bores 209,210 are arranged in evenly spaced vertical arrays within each of vertical slots 208.

Figure 12:
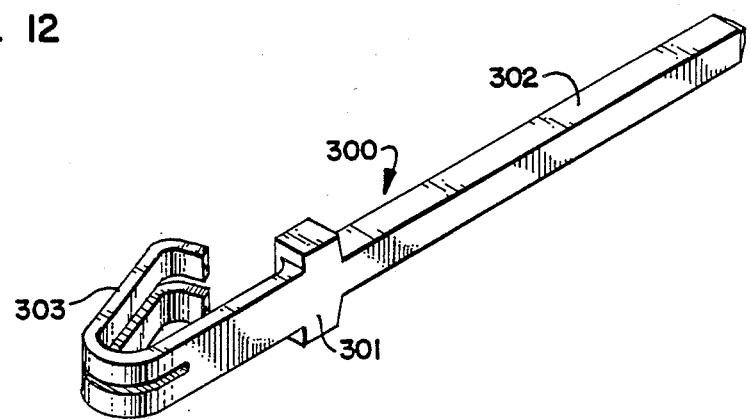
FIG. 12 is a perspective view of a termination clip for use in the mount of FIG. 11.

A plurality of exposed electrical contact members or mount contacts 300 are disposed within each of bores 209. Each of mount contacts 300 is identical to that shown in FIG. 12. Contact 300 includes a body portion 301, a wire wrap termination pin 302 extending from one side of body portion 301. A spring contact 303 extends from body portion 301 on a side thereof opposite pin 302.

Contact 300 is disposed within bores 209 with pi 302 extending through bore 209 and beyond the exterior of the back wall 200. The body portion 301 is received within enlarged bore 210. Spring contact portions 303 are disposed in a vertical array within slots 208. Mount contacts 300 are disposed for the spring contacts 303 to make electrical contact with each of the second plurality of circuit board contact points 601-612 when the jack 12 is inserted within mount 10.

As shown best in FIG. 17, bottom wall 202 includes a rear portion 202a and a forward portion 202b. Rear portion 202a is connected to rear wall 200 and extends about half of the length of top wall 201.

Forward portion 202b is comprised of a plurality of individual parallel aligned wall defining members 203. Each of members 203 is aligned with the plane of slots 208. Slots 206 are formed through both rear portion 202a and wall defining members 203 with the slots extending centrally down the longitudinal dimension of members 203. In FIG. 17, bottom rails 22 of four installed jacks are shown.

Opposing surfaces of wall defining members 203 define a plurality of openings 370 extending through forward wall portion 202b. Openings 370 are sized to accommodate a plurality of wires of known size (not shown) extending from wire termination pins 141-145. Free ends of members 203 are provided with enlarged portions 203a sized such that opposing surfaces of enlarged portions 203a define narrow slots 370a in communication with openings 370. Narrow slots 370a permit wires to be slid into and out of openings 370 as desired.

IV. FRAME DESCRIPTION

Figure 14:
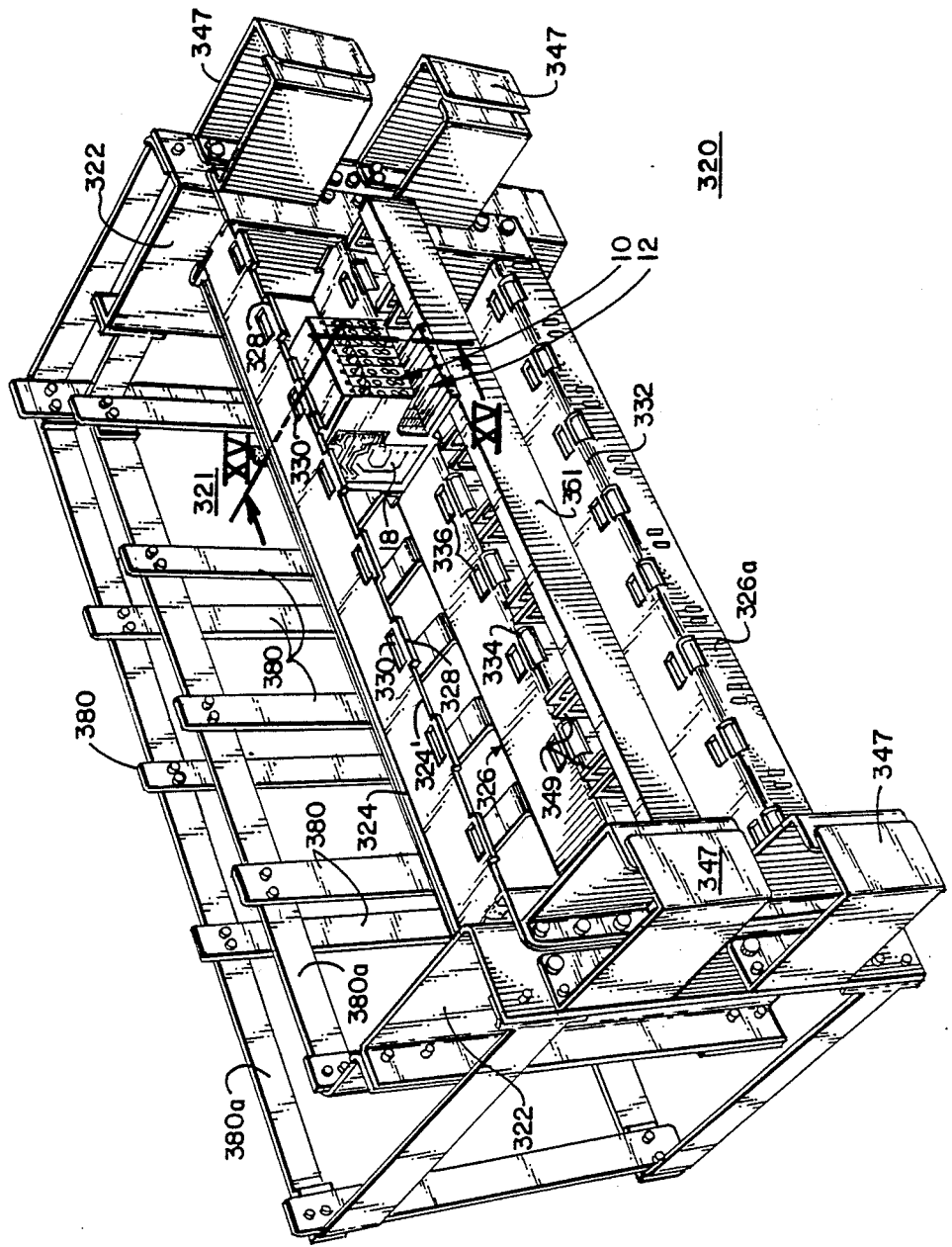
FIG. 14 is a perspective view of a frame including a jack assembly of the present invention.
Figure 16:
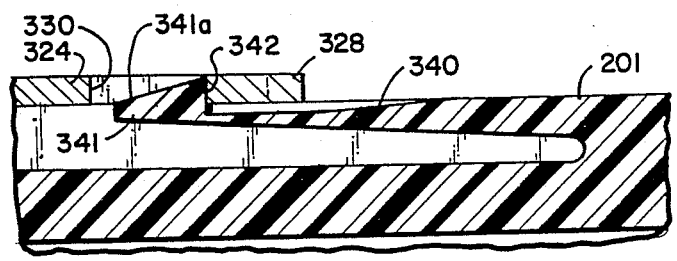
FIG. 16 is an enlarged view showing attachment members for attaching the jack assembly to the frame.
Figure 15:
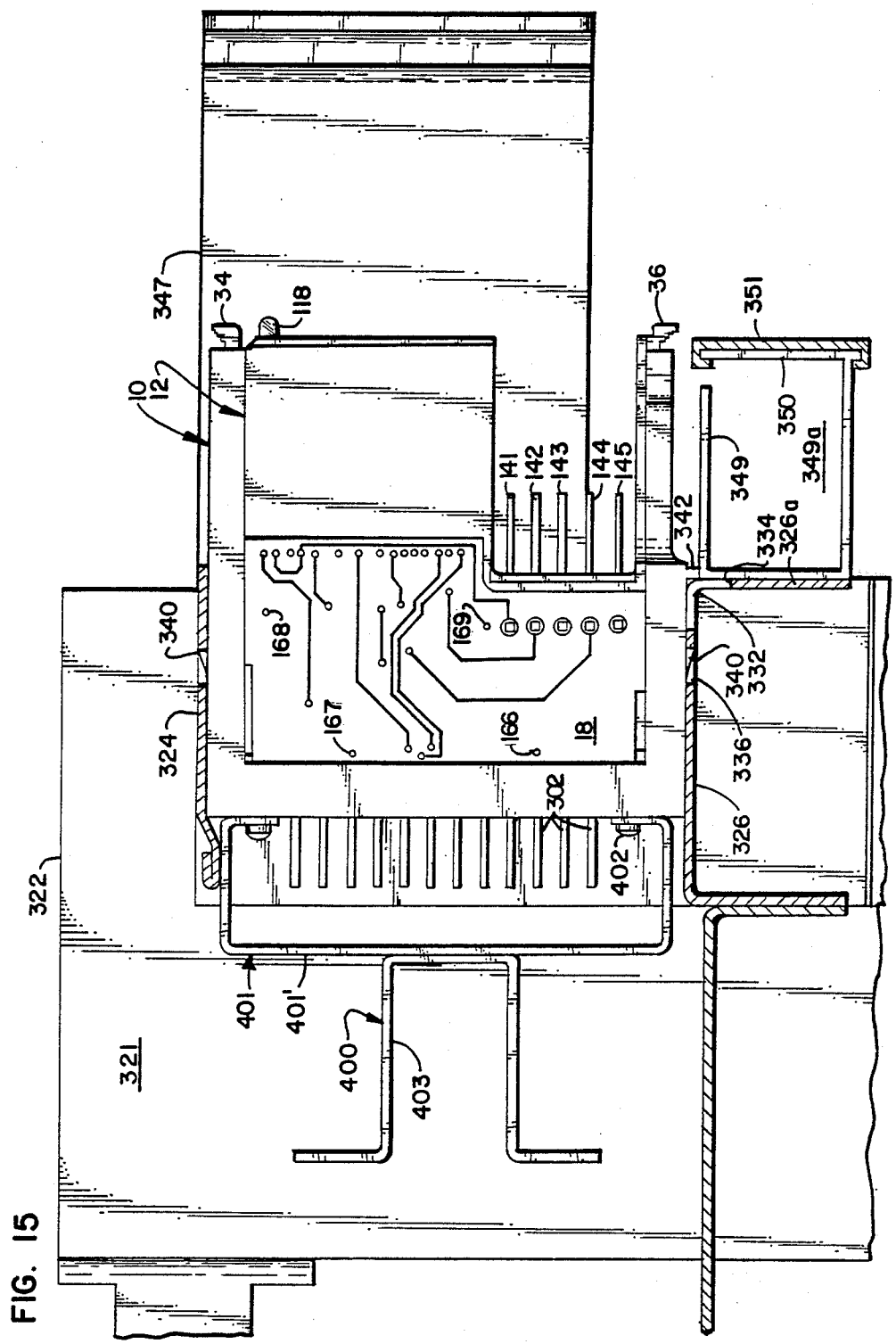
FIG. 15 is a view taken along line XV–XV of FIG. 14.

Referring now to FIGS. 14-16, the jack assembly is shown in combined use with a frame 320. The jack assembly shown within frame 320 includes a mount 10 and has eight jacks 12 secured within mount 10.

The fame 320 includes a pair of spaced apart vertical supports 322. A bracing network of vertical and horizontal bracing members 380,380a, respectively, support vertical supports 322. A first horizontal support plate 324 extends between vertical supports 322. Disposed beneath plate 324 is a second horizontal support plate 326. Bracing 380,380a, vertical supports 322 and horizontal support plates 324,326 are mutually spaced apart to define a frame interior 321 through which cables (not shown) may be drawn.

Disposed along a straight forward edge 324' of first plate 324 are a plurality of projecting tabs 328. Immediately behind each of tabs 328 is a generally rectangular shaped hole 330 formed through plate 324.

Second horizontal support plate 326 is generally L-shaped in cross section and has a curved corner 332 leading to a vertical face 326a extending beneath plate 326. Beneath each of tabs 328, the curved corner is provided with an opening 334. Disposed immediately behind opening 334 is a rectangular opening 336. Openings 334,336 are aligned in general vertical alignment with holes 330.

V. FRAME AND MOUNT LOCKING MECHANISM

Referring now to FIG. 1, top wall 201 has a pair of linearly aligned spaced apart ribs 336,338 extending transverse to top wall 201. Ribs 336,338 are spaced apart a distance equal to the length of tabs 328.

The top wall 201 includes a cantilevered locking tab 340 the detail of which is shown best in FIG. 16. Tab 340 terminates at a clip 341 having a ramp surface 341' extending from a free end of clip 341 and terminating at a generally vertical stop surface 342. Clip 341 is sized to be received within hole 330 with wall 342 abutting tab 328.

Bottom wall 202 is provided with a tab having a structure identical to that of 340 and, accordingly, is numbered identically. The tab 340 on the bottom wall 202 is disposed to be received within opening 336. The bottom wall 202 has a downwardly protruding ridge 342 at the point of intersection of bottom wall rear portion 202a and forward portion 202b. Ridge 342 is disposed to abut the rounded corner 332 of second horizontal plate 332 when lower clip 340 is received within hole 336.

VI. WIRE MANAGEMENT

The frame 320 includes a plurality of vertically aligned wire management clips 347 disposed on each of the vertical supports 322. A plurality of fanning clips 349 are disposed connected to second horizontal support plates 326 on vertical surface 326a. The fanning clips 349 define a generally horizontal wire management trough 349a extending between vertical supports 322. A forward vertical edge 350 of fanning clips 349 act as a support for an identification plate 351 which extends between vertical supports 322 and may include space for writing identifying information.

VII. OPERATION

With the apparatus as described, an operator can wire the mount 10 by pulling a cable from frame interior 321 and passing the cable between horizontal dually connected to wire wrap termination pins 302 extending from back wall 200.

Figure 18:
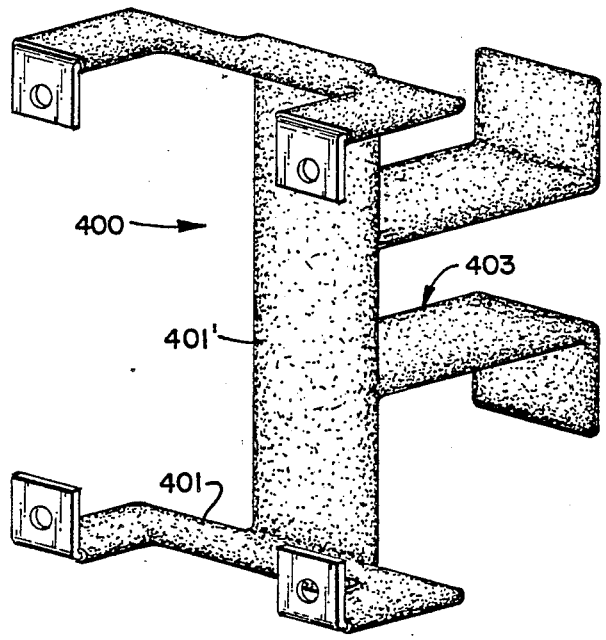
FIG. 18 is a perspective view of a wire mount bracket for use with the present invention.

To assist in wire management, a wire mount bracket 400 is connected to back wall 200. Mounting bracket 400 is shown in FIGS. 15 and 18 and primarily consists of a first member 401 connected to back wall 200 by a plurality of screws 402. Member 401 has a vertical surface 401' which is spaced from pins 302. A flanged U-shaped bracket 403 is connected to member 401. After terminating wires on pins 302, an operator can simply wrap the cable around bracket 403 to insure that the cable will not be jostled or otherwise result in wires being pulled off of pins 302.

With the pins 302 of mount 10 being fully wired, the mount 10 is inserted into the frame 320 with clips 340 received within holes 330,336 thereby locking the mount 10 to frame 320. As mount 10 is installed, ramp 341a engages the tab 328 and tab 340 flexes with the tab 340 passing beneath tab 328. When clip 341 reaches opening 330, clip 341 snaps into opening 330 with locking surface 342 acting against tab 328 to retain the clip 341 in opening 330. Similarly, the lower tab 340 locks the mount 10 into second horizontal support plate 326.

An operator installs each of the jacks 12 by grasping the jack and depressing tabs 34,36 toward one another. The operator aligns rails 20,22 with slots 204,206 and slides the jack 12 into the mount until lock blocks 30,32 are aligned with holes 205,207. When this alignment occurs, the operator can release the tabs 34,36 and lock blocks 30,32 are urged by resiliency of members 26,28 into holes 205,207 thereby locking the jack 12 within mount 10.

As the jack 12 is inserted into mount 10, the second plurality of circuit board contact points 601–612 are moved into sliding electrical contact with clips 303 in slot 208. Therefore, electrical communication is now made between the wires terminated on pins 302 and desired contact points 601–612.

An operator performs desired cross-connect wiring by terminating a wire on wire wrap termination pins 141–145 and cross-connecting the wires to another jack or any other device. The wires which are terminated on pins 141–145 may be passed through openings 370 into the trough 349a and onto wire control clips 347.

As can be seen from the foregoing description, an operator does not need access to the back of the frame in order to make cross-connection wiring. Indeed, the operator never has to get to the back of the frame for any wiring. When it is desired to change wiring on the back of the mount 10, the mount 10 can simply be removed and rewiring accomplished from the front of the frame. Once the mount 10 is wired and installed, all cross-connect wiring is done on the front wall of the frame. With the jacks 12 so installed and cross-connected, the jacks 12 can be used in a customary purpose for DSX jacks in that plugs 108 can be inserted as desired into the IN, OUT or monitor bores for whatever purpose intended.

VIII. CIRCUIT ENHANCEMENT FLEXIBILITY

In telephone offices, telephone lines are frequently taken from a DSX bay to another piece of equipment for signal enhancement. A common signal enhancement apparatus is repeater circuitry for correcting losses which might otherwise obscure a digital signal. In the prior art, operators would wire from a DSX bay to a bay of repeaters. With the use of the present invention, jacks 12 can be fabricated having circuit boards 18 which include circuit elements to accomplish repeater functions. As a result, the jack 12 can perform both cross-connect and repeater functions in a single piece of equipment. As shown, jack 12 includes twelve of contact points 601–612. Only seven of these are needed for conventional DSX functions. The remainder are available for signal enhancements.

In the event additional circuit components are added to board 18, it is desireable to add slits or openings to mount top wall 201, back wall 200 and bottom wall 202 for air circulation.

IX. CONCLUSION

From the foregoing detailed description of the present invention, it has been shown how the objects of the invention have been obtained in the preferred manner. The present invention provides for a jack assembly which does not require access to the back of a DSX frame and provides efficient cross-connecting since cross-connect terminals are provided on the front of the jack. Also, the design provides for flexibility and added functions to the DSX jack. The frame together with the assembly provide for efficient wire management.

While the foregoing detailed description of the present invention describes the invention in a preferred embodiment, it will be appreciated that it is the intent of the invention to include all modifications and equivalent designs. Accordingly, the scope of the present invention is intended to be limited only by the claims which are appended hereto.

We claim:

1. A jack assembly comprising:

a mount having a plurality of exposed electrical contact members disposed in a predetermined array;

a plurality of jacks having predetermined forward walls;

attaching means for releasably attaching each of said plurality of jacks to said mount with said jacks in side-by-side relation and with said forward walls exposed to an operator opposing said assembly, said attaching means accommodating individual removal of said jacks by said operator when opposing said forward walls and with said jacks removably insertable onto said mount by an operator placing a jack in an inserted position;

each of said jacks including a jack body formed of dielectric material, said bodies having an interior chamber and a plurality of bores extending through said forward walls in communication with said chamber, said bores sized to receive a plug of predetermined dimensions and having a tip contact and a ring contact;

a plurality of electrically conductive spring contacts disposed within said chamber;

securing means for securing first ends of said spring contacts to said body with said first ends presenting electrical contact points disposed in a predetermined array;

said plurality of spring contacts including tip spring contacts disposed to make electrical contact with tip contacts of plugs inserted within said bores, said plurality further including ring spring contacts disposed to make electrical contact with ring contacts of said plugs, each of said jacks having a set of ring spring contacts and tip spring contacts;

connecting means for connecting a circuit board to said body;

said circuit board including circuitry having a first plurality and a second plurality of circuit contact points, said first plurality of circuit contact points disposed on said circuit board to make electrical contact with said electrical contact points of said spring contact first ends when said circuit board is connected to said body, said second plurality of circuit contact points disposed for said second plurality to make electrical contact with predetermined ones of said plurality of exposed electrical contact members when said jack is attached to said mount in said inserted position;

a plurality of wire termination members secured to said body and having wire termination ends exposed outside said body to an operator facing said forward wall;

said plurality of wire termination members each having termination member contacts disposed in a predetermined array;

said circuitry including a third plurality of circuit contact points disposed on said circuit board to make electrical contact with said termination member contacts when said circuit board is connected to said body and means for electrically connecting said third plurality of circuit contact points to at least a portion of said plurality of spring contacts.

2. An assembly according to claim 1 wherein said plugs include electrically conductive sleeves, said bores being sized for said sleeves to be received within said chamber when a plug is inserted into said bores, said plurality of spring contacts including a grounding spring contact disposed to make electrical contact with a sleeve of a plug inserted within a bore.

3. An assembly according to claim i wherein each of said plurality of jacks has a narrow forward wall exposed when said jack is attached to said mount, said bores extending through said forward wall, said jacks disposed within said mount in side-by-side relation with a jack configured to slide relative to an adjacent jack when inserted and removed from said mount.

4. An assembly according to claim 3 wherein said plurality of bores includes a pair of bores on said front wall spaced apart a predetermined distance, said jacks sized for bores of adjacent jacks disposed within said mount to be spaced apart a distance equal to said predetermined distance.

5. An assembly according to claim 4 wherein said plurality of bores includes a monitor bore, said plurality of spring contacts includes tip and ring spring contacts to be engaged by a plug received within said bore, said plurality of springs further including circuit activation spring contacts disposed to be urged into electrical connection when a plug is inserted within said monitor bore;
 said circuitry including means for controlling illumination of a light means disposed on said front wall.

6. An apparatus according to claim 1 wherein said body includes a plurality of raised platforms disposed within said chamber, opposing surfaces of said raised platforms defining spring receiving slots;
 said first ends of said spring contacts disposed within said spring receiving slots.

7. An assembly according to claim 1 comprising a frame including first and second spaced apart generally horizontal support plates;
 said support plates spaced apart a distance sized to receive said mount between said plates with means for locking said mount to said plates when said mount is in a predetermined desired position.

8. A jack assembly comprising:
 a mount having a plurality of exposed electrical contact members disposed in a predetermined array;
 a plurality of jacks having predetermined forward walls;
 attaching means for releasably attaching each of said plurality of jacks to said mount with said jacks in side-by-side relation and with said forward walls exposed to an operator opposing said assembly, said attaching means accommodating individual removal of said jacks by said operator when opposing said forward walls and with said jacks removably insertable into said mount by an operator placing a jack in a predetermined inserted position;
 each of said jacks including a jack body formed of dielectric material, said bodies having an interior chamber and a plurality of bores extending through said forward walls in communication with said chamber, said bores sized to receive a plug of predetermined dimensions and having a tip contact and a ring contact;
 a plurality of electrically conductive spring contacts disposed within said chamber;
 securing means for securing first ends of said spring contacts to said body with said first ends having electrical contact points;
 said plurality of spring contacts including tip spring contacts disposed to make electrical contact with tip contacts of plugs inserted within said bores, said plurality further including ring spring contacts disposed to make electrical contact with ring contacts of said plugs, each of said jacks having a set of ring spring contacts and tip spring contacts;
 circuit means including a plurality of exposed circuit contact points in electrical communication with at least a portion of said plurality of springs, said plurality of exposed circuit contact points disposed on said jack for said circuit contact points to make electrical contact with predetermined ones of said plurality of exposed electrical contact members when said jack is attached to said mount in said inserted position;
 a plurality of wire termination members secured to said body and having wire termination ends exposed outside said body to an operator facing said forward wall;
 said plurality of wire termination members each having termination member contacts;
 said circuit means including means for electrically connecting said termination member contacts with at least a portion of said plurality of spring contacts.

9. An assembly according to claim 8 wherein said circuitry includes circuit enhancement components.

10. An assembly according to claim 9 wherein said circuitry includes repeater circuit components.

11. An assembly according to claim 1 wherein said mount includes a top wall, a bottom wall and a back wall;
 said top wall, bottom wall and said jacks having cooperating slots and grooves formed therein for said jacks to be slidably received within said mount;
 said plurality of exposed electrical contact members of said mount disposed in said back wall;
 said attaching means for releasably attaching each of said plurality of jacks to said mount including means for releasably locking said jacks to said mount when said second plurality of circuit contact points of said circuit board are in electrical contact with said plurality of exposed electrical contact members in said mount back wall.

12. An assembly according to claim 11 wherein said plurality of electrical contact members comprise a plurality of wire termination members having wire termination ends exposed to said back wall of said mount and having electrical contact clips exposed within an interior of said mount;
 said second plurality of circuit board contact points including a plurality of exposed tabs on said circuit board and aligned to be in sliding electrical contact with said clips when said jacks are attached to said mount.

13. An assembly according to claim 11 wherein said bottom wall is provided with a plurality of openings therethrough with said plurality of openings disposed between adjacent jack positions.

14. A jack assembly comprising:
 a mount having a plurality of exposed electrical contact members disposed in a predetermined array;
 a plurality of jacks each having a jack body housing a plurality of spring contacts, said jacks having predetermined forward walls with plug receiving means for receiving a plug, said contacts disposed for said plug to be in electrical communication with predetermined ones of said spring contacts when said plug is received by said plug receiving means;

said jacks further including a circuit board for each jack with said board connected to said body, circuit means carried on said board in electrical communication with said spring contacts;

means for removably securing each of said jacks to said mount with each of said jacks individually removably, when secured to said mount said jacks maintained in closely spaced side-by-side relation and presenting said forward walls to an operator opposing said assembly;

said circuit means including a plurality of exposed circuit contact points in electrical communication with at least a portion of said plurality of said spring contacts, said plurality of exposed circuit contact points disposed on said jack for said circuit contact points to make electrical contact with predetermined ones of said plurality of exposed electrical contact members when said jack is attached to said mount;

a plurality of wire termination members secured to said body and having wire termination ends exposed outside said body to an operator facing said forward wall;

said plurality of wire termination members each having termination member contacts;

said circuit means including means for electrically connecting said termination member contacts with at least a portion of said plurality of spring contacts.

* * * * *

UNITED STATES PATENT AND TRADEMARK OFFICE
CERTIFICATE OF CORRECTION

PATENT NO. : 4,840,568

DATED : June 20, 1989

INVENTOR(S) : Dennis M. Burroughs, et al.

It is certified that error appears in the above-identified patent and that said Letters Patent is hereby corrected as shown below:

Column 1, line 39, before "mined", insert --flexibility of a DSX jack. We have also deter- --;

Column 4, line 6, "84-8" should be --94-98--;

Column 5, line 12, "127'" should be --127a'--;

Column 5, line 17, "128a'" (2nd) should be --128a''--;

Column 5, line 37, "132" should be --132'--;

Column 5, lines 41-42, delete "132b', 132b''' are urged 132 into chamber 72, tabs 132b" and insert --132 into chamber 72, tabs 132b', 132b", 132b''' are urged--;

UNITED STATES PATENT AND TRADEMARK OFFICE
CERTIFICATE OF CORRECTION

PATENT NO. : 4,840,568

DATED : June 20, 1989

INVENTOR(S) : Dennis M. Burroughs, et al.

It is certified that error appears in the above-identified patent and that said Letters Patent is hereby corrected as shown below:

Column 9, line 6, "pi" should be --pin--;

Column 9, line 43, "fame" should be --frame--;

Column 10, line 36, after "horizontal", insert --plates 324, 326. Wires from the cable may be indivi- --;

Column 13, line 3, "i" should be --1--.

Signed and Sealed this

Twentieth Day of March, 1990

Attest:

JEFFREY M. SAMUELS

*Attesting Officer*   *Acting Commissioner of Patents and Trademarks*